(12) United States Patent
Walker et al.

(10) Patent No.: US 6,882,185 B1
(45) Date of Patent: Apr. 19, 2005

(54) EXPONENTIAL CURRENT GENERATOR AND METHOD

(75) Inventors: Brett Christopher Walker, San Diego, CA (US); Peter C. Gazzerro, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/109,504

(22) Filed: Jul. 2, 1998

(51) Int. Cl.[7] ............................................. H03F 3/45
(52) U.S. Cl. ......................... 327/103; 327/346; 327/67
(58) Field of Search ................................ 327/346, 563, 327/103, 65, 66, 67; 330/254, 257, 259, 261

(56) References Cited

U.S. PATENT DOCUMENTS

| | | | |
|---|---|---|---|
| 3,641,450 A | | 2/1972 | Lunn ........................... 330/254 |
| 4,335,358 A | * | 6/1982 | Hoeft .......................... 330/257 |
| 4,562,406 A | | 12/1985 | Baker ........................... 330/85 |
| 4,628,280 A | * | 12/1986 | Seevinck et al. ............ 330/252 |
| 4,959,622 A | * | 9/1990 | Kearney ....................... 330/257 |
| 4,963,836 A | | 10/1990 | Noguchi et al. ............. 330/254 |
| 5,157,350 A | | 10/1992 | Rubens ......................... 330/254 |
| 5,406,223 A | * | 4/1995 | Vulih et al. .................. 330/258 |
| 5,418,494 A | | 5/1995 | Betti et al. ................... 330/254 |
| 5,451,901 A | | 9/1995 | Welland ....................... 330/133 |
| 5,471,171 A | | 11/1995 | Itakura et al. ............... 330/253 |
| 5,909,136 A | * | 6/1999 | Kimura ........................ 327/356 |

FOREIGN PATENT DOCUMENTS

| | | | |
|---|---|---|---|
| EP | 0507388 | 10/1992 | ............. H03F/3/45 |
| EP | 632583 A | 1/1995 | ............. H03G/1/00 |
| JP | 1058104 | 6/1989 | ............. H03C/3/00 |
| WO | 9732393 | 9/1997 | ............. H03G/1/00 |

OTHER PUBLICATIONS

" A Downconverter for Use In A Dual Mode AMPS/CDMA Chipset." By Douglas et al., Microwave Journal Feb. 1996, pp 20,22,24,26,28,33,34,36,39,40 and 42.

"A DC to 1–GHz Differential Monolithic Variable–Gain Amplifier", by Meyer et al., IEEE Journal,vol. 26 No 11, Nov. 1991, pp 1673–1679.

"HBT Technology Adds Power to CDMA Chipset", by Neal, Microwaves & RF, Dec. 1994, pp 205–207.

"Design of High Performance Negative–Feedback Amplifiers" by Nordholt, *Studies in Electrical and Electronic Engineering 7, Elsevier Scientific Publishing Co. New York, 1983* pp 34–39, 64–69 and 131.

* cited by examiner

*Primary Examiner*—Timothy P. Callahan
*Assistant Examiner*—Terry L. Englund
(74) *Attorney, Agent, or Firm*—Philip R. Wadsworth; Charles D. Brown; Nicholas J. Pauley

(57) ABSTRACT

An apparatus and method of generating a current pair $I_p$, $I_m$ where the ratio of the pair is exponentially related to a control signal, and where either $I_p$ or $I_m$ is greater than or less than a minimum or maximum value includes a feedback correction circuit used to sense the value of $I_m$ or $I_p$. The correction circuit supplies a boost current $I_{boost}$ when the sensed value of $I_p$ or $I_m$ is less than or greater than the minimum or maximum value. $I_{boost}$ is preferably maintained proportional to the difference of the desired value and $I_p$ or $I_m$.

14 Claims, 5 Drawing Sheets

EXPONENTIAL CURRENT GENERATOR AND METHOD

CROSS REFERENCE TO RELATED APPLICATIONS

This application is related to commonly assigned U.S. Pat. No. 5,880,631 issued on Mar. 9, 1999 filed Jan. 27, 1997 entitled "High Dynamic Range Variable Gain Amplifier," which is hereby incorporated by reference.

BACKGROUND OF THE INVENTION

I. Field of the Invention

This invention relates to exponential current generators and methods, and more particularly to generators used in variable gain amplifiers (VGA).

II. Description of the Related Art

As noted in the co-pending and related application cited above, variable gain amplifiers (VGA) may be employed to amplify received signals and signals to be transmitted. The gain of the VGA is determined by a control signal where the gain of the VGA in some applications is ideally exponentially (or, "linear in dB") related to the control signal. The VGA may have an input stage and one or more current amplifier stages coupled to the input stage. The input stage receives a voltage signal, converts the voltage signal to current signals, and amplifies the current signals. The current amplifier stage further amplifies the current signals generated by the input stage.

Ideally, the gain of each current amplifier is exponentially related to the control signal. The control signal may be any type of control signal including a control current, digital control, or voltage signal, for example. In the co-pending and related application a voltage control signal, $V_{control}$ is employed to determine or control the gain or each current amplifier. As also described in the co-pending application, each current amplifier stage employs an exponential current generator that receives $V_{control}$ and generates a pair of current signals, $I_m$ and $I_p$, where the ratio of $I_p/I_m$ is exponentially related to the control signal $V_{control}$. The pair $I_m$, $I_p$ is used to control the gain of the current amplifier as described in the co-pending application.

As noted above, a current amplifier stage is coupled to the input stage of the VGA. Due to certain circuit dynamics associated with coupling the input stage to a current amplifier stage, it is desirable that $I_m$ not fall below some minimum current value ("$I_{bleed}$"). As described in the related and incorporated co-pending application, in order to prevent $I_m$ from falling below a certain minimum current value, a current source is included to produce a fixed current $I_{bleed}$ in parallel with $I_m$. Adding $I_{bleed}$ to $I_m$ ensures a minimum tail current in the input stage of the translinear loop of the current amplifier as described in the related application.

Disadvantageously, the addition of $I_{bleed}$ to $I_m$ changes the ratio of the current pair produced by the exponential current generator to be proportional to $I_p(I_m+I_{bleed})$. This ratio is disadvantageously not exponentially related to the control signal $V_{control}$. This is particularly true as the ratio becomes large and $I_m$ becomes corresponding small, i.e., as $I_m$ approaches $I_{bleed}$. Disadvantageously, this distortion causes the gain of a current amplifier employing the generator to become more linearly related than exponentially related to $V_{control}$. This distortion can create power control problems when the amplifier is used as part of a VGA that is used in a transmitter, in particular in a transmitter that generates a Code Division Multiple Access (CDMA) signal. Thus, a need exists for an improved exponential current generator that generates a current pair whose ratio is exponentially related to a control signal even when $I_m$ is less than $I_{bleed}$. The present invention provides such an improved exponential current generator.

SUMMARY OF THE INVENTION

The invention includes an apparatus for generating a current pair, $I_p$, $I_m$ where the ratio of the pair is exponentially related to a control signal. In one embodiment of the present invention, a boost current, $I_{boost}$ is added to a fixed current $I_{fixed}$ to control the minimum or maximum value of either $I_p$ or $I_m$ while keeping the ratio of $I_p/I_m$ exponentially related to the control signal. In a particular embodiment, $I_{boost}$ is added so that $I_m$ is equal to or greater than a minimum value $I_{bleed}$. The apparatus includes a differential amplifier and a correction feedback circuit.

In one embodiment, the differential amplifier generates the current pair, $I_m$, $I_p$, based on the control signal, the fixed current $I_{fixed}$, and the boost current $I_{boost}$. The correction feedback circuit is coupled to the differential amplifier and senses the level of $I_m$. In accordance with this embodiment, the correction feedback circuit generates a boost current $I_{boost}$ when $I_m$ is less than $I_{bleed}$ so that $I_m$ will be greater than $I_{bleed}$ and the ratio of $I_p/I_m$ will still be exponentially related to the control signal.

In a preferred embodiment, $I_{boost}$ is proportional to a difference between $I_{bleed}$ and $I_m$ when $I_m$ is less than $I_{bleed}$, otherwise $I_{boost}$ is zero. The differential amplifier may include a current source that generates the fixed current $I_{fixed}$. In addition, the differential amplifier may further include a pair of BJTs, where the control signal is coupled to the bases of the BJTs to generate the current pair $I_m$, $I_p$. The apparatus may also include a pair of FET current mirrors that are coupled to the differential amplifier. In the preferred embodiment, the feedback circuit may include a current source that generates a current $I_{bleed}$. The feedback circuit may also include at least one FET coupled to the pair of FET current mirrors and the current source. In this embodiment, the at least one FET of the feedback circuit may sense $I_m$.

The present invention also includes a method of generating a current pair, $I_p$, $I_m$ where the ratio of the current pair is exponentially related to a control signal, and where $I_m$ or $I_p$ is ideally greater than or less than a minimum or maximum value. The method may include the steps of inputting the control signal and generating the current pair $I_m$, $I_p$ as a function of at least the control signal and a boost current $I_{boost}$. The method may also include the step of sensing the level of $I_m$ or $I_p$ and generating a boost current $I_{boost}$ when $I_m$ or $I_p$ is less than or greater than the minimum or maximum value.

In a preferred embodiment, $I_{boost}$ may be proportional to a difference between $I_{bleed}$ and $I_m$ when $I_m$ is less than $I_{bleed}$, otherwise $I_{boost}$ is zero. Further, the step of generating a boost current may include the steps of: 1) comparing $I_m$ to $I_{bleed}$; 2) setting $I_{boost}$ to zero when $I_m$ is greater than or equal to $I_{bleed}$; and 3) setting $I_{boost}$ to a proportional difference of $I_{bleed}$ and $I_m$ when $I_m$ is less than $I_{bleed}$.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
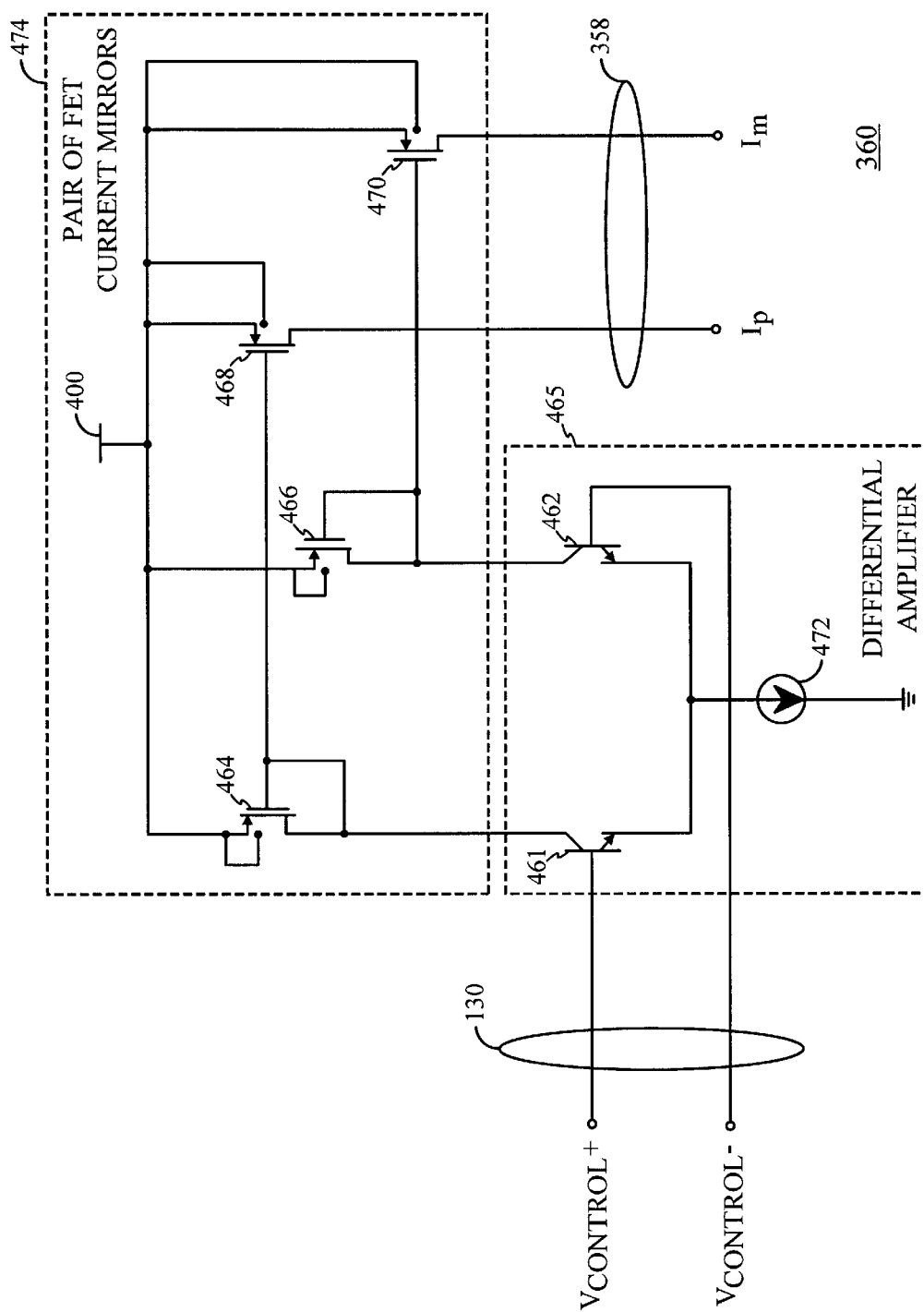
FIG. 1 is a schematic of an exponential function greater described in the related and co-pending application.

FIG. 1 shows an exponential function generator described in the related and co-pending application and is referred to hereafter as the exponential function generator 360. As shown in FIG. 1 and as described in the related application, the generator 360 primarily comprises a differential amplifier 465. The amplifier 465 generates a current pair $I_m$, $I_p$ at an output port 358 as a function of the differential value of a control signal, in this case a voltage control signal $V_{control}$ provided at an input port 130. As shown in FIG. 1, $V_{control}$ is coupled to the bases of Bipolar Junction Transistors (BJT) 461 and 462. The ratio of the collector currents of the BJTs 461 and 462 is exponentially related to the differential base voltage ($V_{control}$) due to the known exponential input voltage-to-output current relationship of BJTs.

A pair of FET current mirrors 474 are used to copy the collector currents that are generated by the pair of BJTs 461, 462. In particular, the collector currents $I_p$ and $I_m$ are provided to devices coupled to the generator 360 at the output ports 358. In the embodiment shown in FIG. 1, the current mirrors 474 include four field effect transistors (FET) 464, 466, 468, and 470. As shown in FIG. 1, the generator 360 also includes a current source 472. The current source 472 generates a fixed current $I_{fixed}$. It is noted that the sum of $I_p$ and $I_m$ is equal to $I_{fixed}$. When the control signal is made large (for a large gain in a current amplifier wherein the generator 360 is employed), $I_p$ becomes large and close to $I_{fixed}$ while $I_m$ becomes small and close to zero. Likewise, as the control signal is made small (for a small gain in the current amplifier), $I_m$ becomes large and close to $I_{fixed}$ while $I_p$ becomes small and close to zero.

As noted above, in some applications of generator 360 it is desirable to control the maximum or minimal value(s) of $I_p$ or $I_m$. For example, it may be desirable to prevent $I_m$ from falling below some minimum value when the control signal is large (for a large gain of the current amplifier). Accordingly, $I_{fixed}$ may be set to a large value. This solution, however, would increase the energy consumption of the generator 360. Ideally, $I_{fixed}$ should be selected to be as small as possible to reduce energy consumption of the generator 360 while providing minimum or maximum value(s) of $I_p$ and $I_m$ for a conservative range of control signal values (or current amplifier gains). The selected value of $I_{fixed}$ in the application presented the co-pending and related application is about 10 mA after scaling.

As noted above in the related application, it is desirable that $I_m$ never fall below a minimum value $I_{bleed}$. To prevent $I_m$ from falling below $I_{bleed}$ while keeping $I_{fixed}$ as small as possible, the value of $I_{bleed}$ was added to $I_m$ after the generation of $I_m$ by generator 360. This disadvantageously changes the ratio of the current pair provided to the current amplifier. In particular, the addition of $I_{bleed}$ to $I_m$, disadvantageously changes the ratio of to $I_p/(I_m+I_{bleed})$. If $I_m$ is much greater than $I_{bleed}$ the effect is negligible. As $I_m$ approaches $I_{bleed}$, however, the effect of the addition of $I_{bleed}$ is more pronounced and the ratio is no longer exponentially related to the control signal ($V_{control}$). This is especially true as the ratio approaches a maximum value and $I_m$ becomes small. The distortion or deviation may be significant in certain applications where the generator 360 can be utilized. For example, this distortion becomes significant when the generator 360 is used as part of a variable gain amplifier (VGA) of a transmitter used to generate CDMA signals. As known to those skilled in the art, power control of CDMA signals is critical in preventing interference between CDMA signals.

Figure 2:
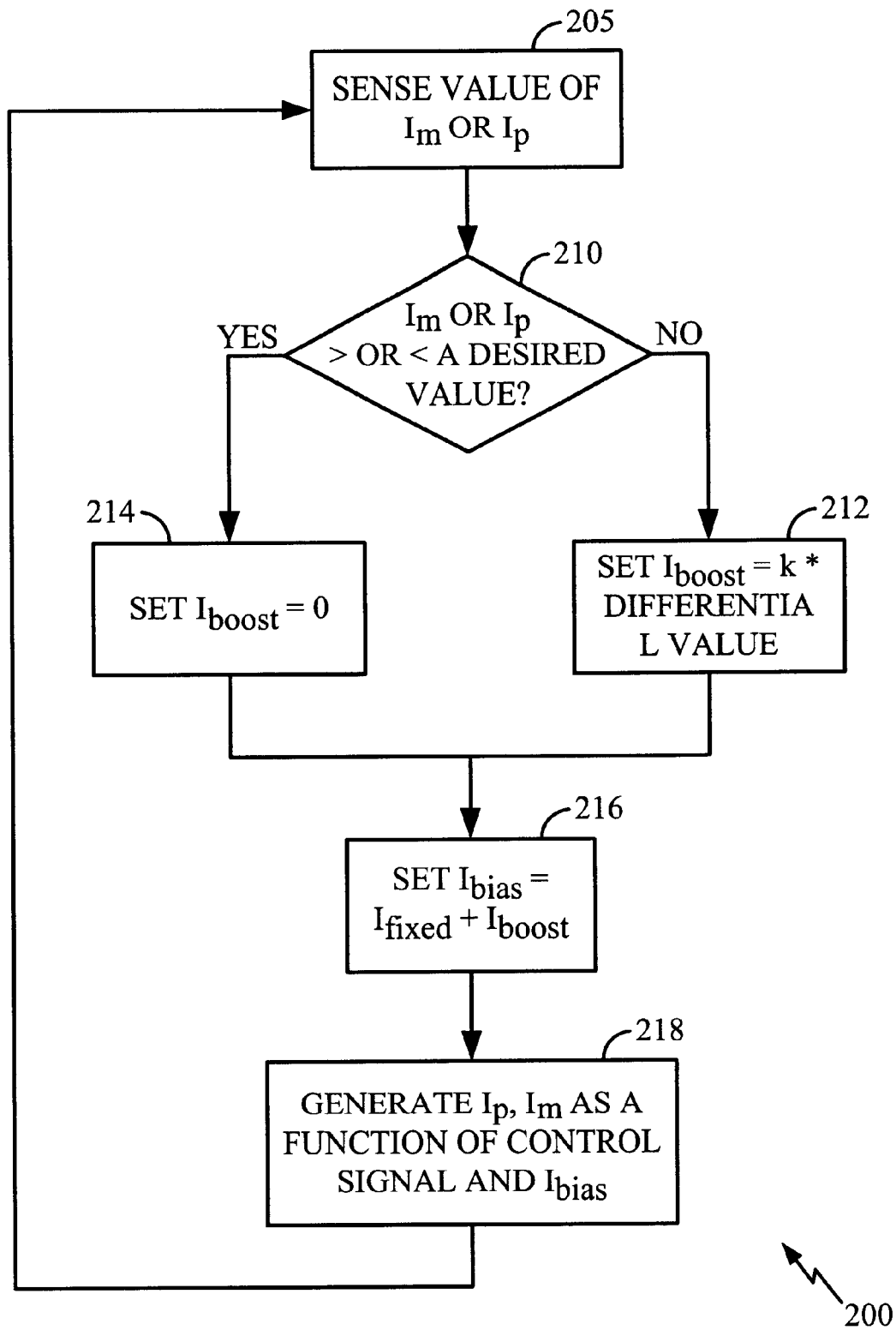
FIG. 2 is a flowchart of a method for generating a current pair in accordance with the invention.

The invention provides an improved apparatus and method of generating the current pair, $I_p$, $I_m$ as a function of a control signal where either $I_p$ or $I_m$ is ideally greater than or less than some minimum or maximum value and the sum of $I_p$ and $I_m$ is equal to a bias current $I_{bias}$. The bias current is equal to the sum of the fixed current $I_{fixed}$ and a boost current $I_{boost}$. One embodiment of an improved method according to the present invention is described with reference to FIG. 2. The method is a continuous process including at least four steps. As shown in FIG. 2, at a step 205, the value of either $I_m$ or $I_p$ is sensed or determined. The method then proceeds to a step 210, where either $I_m$ or $I_p$ is compared with a desired minimum or maximum value. When the value of $I_m$ or $I_p$ is greater than or less than the desired minimum or maximum value, no change to $I_{bias}$ is necessary. In this case, the method proceeds to a step 214 wherein $I_{boost}$ is set equal to zero.

When at step 210, $I_m$ or $I_p$ is determined to be less than or greater than some minimum or maximum value, then the overall current must be increased or decreased so that $I_m$ or $I_p$ is made greater than or less than the desired minimum or maximum value. Note: the addition or subtraction of current does not effect the ratio of $I_p/I_m$. Therefore, when at step 210 it is determined that $I_m$ or $I_p$ is less than or greater than some minimum or maximum value, then the boost current $I_{boost}$ is set equal to a difference between value of $I_m$ or $I_p$ (differential value) and the desired minimum or maximum value times a gain, k. In a preferred embodiment, k is approximately equal to 100. Then, the method proceeds to step 216, whereat $I_{bias}$ is set equal to the value of $I_{fixed}+I_{boost}$. As noted above $I_{fixed}$ is a fixed current whose value is selected for nominal ratios and values of $I_p$ and $I_m$. The method then proceeds to a step 218, wherein $I_p$ and $I_m$ are generated as a function of the control signal and $I_{bias}$. Using this technique, $I_{fixed}$ may be set to a low value to preserve energy and then increased when necessary.

An example of an application of the method of the present invention is described with reference to the system presented in the co-pending and related application. As noted above, in the related application it is desirable that $I_m$ never fall below a minimum value, $I_{bleed}$ ($I_{bleed}$ is approximately equal to 1 mA in one embodiment). Using the above method, at step 205, the value of $I_m$ would be sensed or determined. Then at step 210, $I_m$ would be compared to $I_{bleed}$. When $I_m$ is determined to be greater than or equal to $I_{bleed}$, no current would be added and the method would proceed to step 214 whereat $I_{boost}$ would be set to zero. When $I_m$ is determined to be less than $I_{bleed}$ at step 210, the method would proceed to step 212 whereat $I_{boost}$ would be set equal to k*($I_{bleed}-I_m$) (the differential value). Then at step 216, $I_{bias}$ would be set to $I_{fixed}+I_{boost}$ (where $I_{fixed}$ is approximately 10 mA after scaling in this embodiment). The above method, thus could be used to modify the generator 360 to produce the current pair $I_p$, $I_m$ where $I_m$ is always greater than $I_{bleed}$ while the exponential ratio of the current pair to control signal ($V_{control}$ in this embodiment) is maintained. A block diagram of a preferred apparatus 400 of the present invention capable of implementing the method shown in FIG. 2 is described below with reference to FIG. 3.

Figure 3:
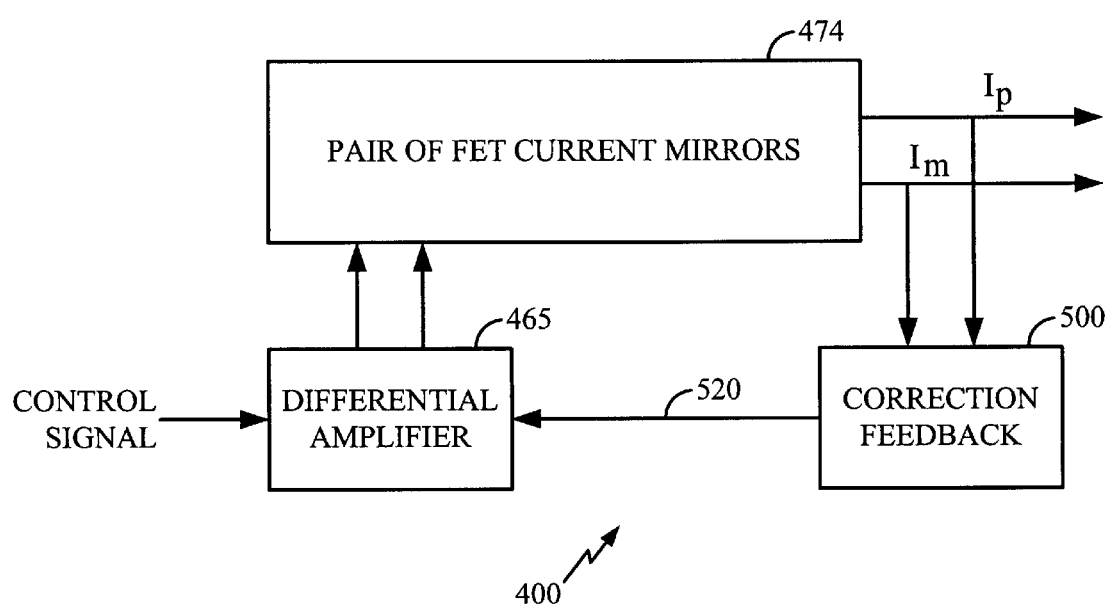
FIG. 3 is a block diagram of an improved exponential function generator made in accordance with the present invention.
Figure 4:
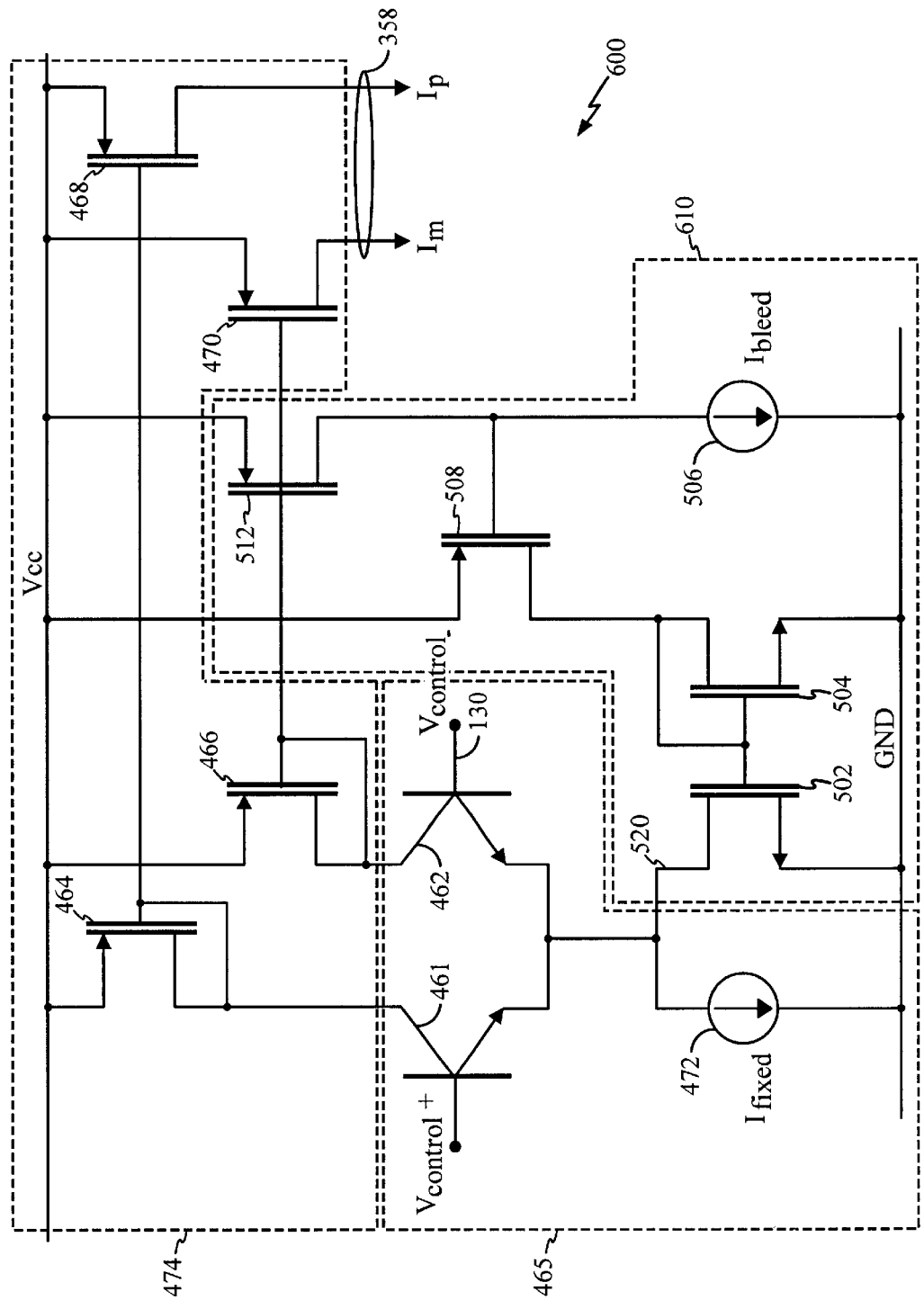
FIG. 4 is a schematic of an improved exponential function generator according to the present invention.

As shown in FIG. 3, the apparatus 400 includes a current mirror circuit 474, a differential amplifier 465, and a correction feedback circuit 500. The current mirror circuit 474 and the differential amplifier 465 are similar to those described above with reference to FIG. 1. As noted above, the apparatus 400 includes a correction feedback circuit 500 that is coupled to the differential amplifier 465 via a link 521. In addition, the correction feedback circuit 500 is coupled to the current mirror circuit 474 to sense or sample the value of $I_m$ or $I_p$. The correction feedback circuit 500 generates a current $I_{boost}$ as described above and provides $I_{boost}$ to the differential amplifier 465 via the link 520. The differential amplifier 465 generates the current pair, $I_p$, $I_m$ as a function of the control signal, $I_{fixed}$, and $I_{boost}$ as described above. FIG. 4 presents an embodiment of a generator 600 according the present invention for use as generator 360 in the co-pending and related application.

As shown in FIG. 4, the current mirror circuit 474 and the differential amplifier 465 are identical to that described above with reference to FIG. 1. In this exemplary embodiment, the correction feedback circuit 610 includes four FETs 512, 508, 502, 504, and a current source 506. The current source 506 generates a current $I_{bleed}$. Similar to the feedback correction circuit 500 as described above, the feedback circuit 610 generates the current $I_{boost}$ 520 that is effectively added to $I_{fixed}$ to generate the current $I_{bias}$. As one of ordinary skill in the electronics art will note, in this feedback circuit 610 when $I_m$ is sensed to be greater than $I_{bleed}$, $I_{boost}$ is becomes to zero. When $I_m$ is sensed to be less than $I_{bleed}$, then the feedback circuit 610 generates a current $I_{boost}$ that is equal to $k*(I_{bleed}-I_m)$, where k is the gain of the feedback circuit 610 and is also a function of the FETs 502, 504. As noted above, in a preferred embodiment, k is approximately equal to 100. Thus, generator 600 may be used as a substitute for generator 360.

Figure 5:
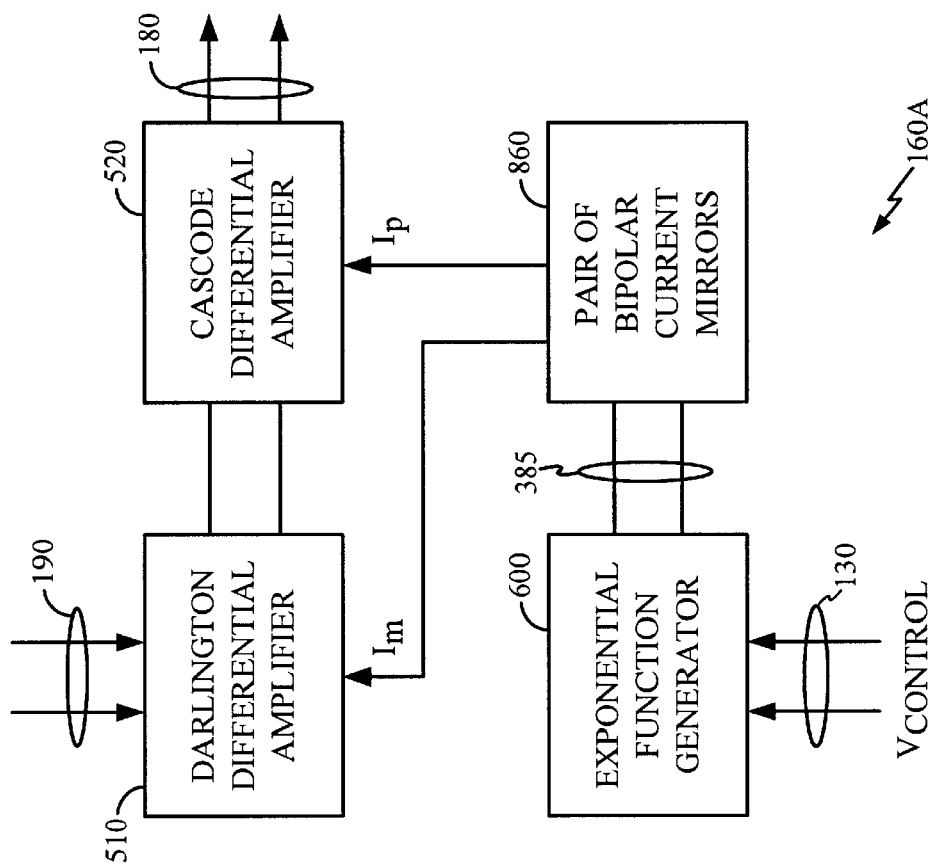
FIG. 5 is a block diagram of a current amplifier adapted for use with the exponential function generator shown in FIG. 4.

In particular, the exponential function generator 600 may be part of the current amplifier, such as an amplifier 160A. The function of the exponential function generator 600 in this embodiment is briefly described with reference to FIG. 5. As shown in FIG. 5, the current amplifier 160A includes a darlington differential amplifier 510, a cascode differential amplifier 520, a pair of bipolar current mirrors 860 and the exponential function generator 600. The darlington differential amplifier 510, cascode differential amplifier 520, and pair of bipolar current mirrors 860 are described in detail in the co-pending related application.

Briefly, signal currents 190 are amplified by the current amplifier 160A to generate amplified, signal currents 180 as a function of a control signal, in particular, a voltage control signal, $V_{control}$ 130. The exponential function generator 600 generates the current pair $I_p$, $I_m$ at an output 358. As noted, the ratio of $I_p/I_m$ is ideally exponentially related to $V_{control}$. The current pair $I_p$, $I_m$ is used to control the gain of the amplifiers 510, 520 as described in the co-pending and related application.

Note that the current amplifier 160A may be part of a VGA. Further, the VGA may be used in transmit or receive circuitry of a mobile transceiver unit. In addition, the exponential function generator 400 may used in many other applications where it is desirable or necessary to provide linear in dB gain control. For example, the exponential function generator 400 may be used to replace the generator 360 described in the co-pending related application.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. An apparatus for generating a current pair $I_p$, $I_m$ wherein the ratio of the pair is exponentially related to a control signal, and wherein one of $I_p$ and $I_m$ is one of greater than a minimum value and less than a maximum value, the apparatus comprising:

a differential amplifier including a first current source that generates a fixed current $I_{fixed}$, a pair of BJTs, each BJT including a base and wherein the control signal is coupled to the bases of the BJTs, and a pair of FET current mirrors operatively coupled to the differential amplifier in combination with a feedback correction circuit, the differential amplifier generating the current pair $I_m$, $I_p$ as a function of the control signal and a bias current $I_{bias}$, where $I_{bias}$ is a function of a boost current $I_{boost}$, wherein the sum of $I_p$ and $I_m$ equals $I_{bias}$; and the correction feedback circuit, coupled to the differential amplifier, for sensing one of $I_m$ and $I_p$ and generating the boost current $I_{boost}$ when one of $I_m$ and $I_p$ is one of less than the minimum value and greater than the maximum value, wherein $I_{boost}$ is proportional to a difference between one of the minimum value and the maximum value and one of $I_m$ and $I_p$, and $I_{bias}$ is equal to the sum of $I_{boost}$ and the fixed current $I_{fixed}$.

2. The apparatus of claim 1, wherein $I_{boost}$ is proportional to a difference between the minimum value and $I_m$.

3. The apparatus of claim 1, wherein $I_{boost}$ is proportional to a difference between a minimum value $I_{bleed}$ and $I_m$ and the feedback circuit includes a second current source for generating a current equal to $I_{bleed}$.

4. The apparatus of claim 3, wherein the feedback circuit further includes at least one FET operatively coupled to the pair of FET current mirrors and the second current source.

5. The apparatus of claim 4, wherein the at least one FET of the feedback circuit senses $I_m$.

6. An apparatus for generating a current pair $I_p$, $I_m$ wherein the ratio of the pair is exponentially related to a control signal, and wherein one of $I_p$ and $I_m$ is one of greater than a minimum value and less than a maximum value, the apparatus comprising:

a differential amplifier means for generating the current pair $I_m$, $I_p$ as a function of the control signal and a bias current $I_{bias}$, where $I_{bias}$ is a function of a boost current $I_{boost}$, wherein the sum of $I_p$ and $I_m$ equals $I_{bias}$; wherein the differential amplifier means includes a first current source that generates a fixed current $I_{fixed}$, $I_{boost}$ is proportional to a difference between one of the minimum value and the maximum value and one of $I_m$ and $I_p$, $I_{bias}$ is equal to the sum of $I_{boost}$ and the fixed current $I_{fixed}$ and a correction feedback circuit means, coupled to the differential amplifier means, the feedback circuit means for sensing one of $I_m$ and $I_p$ and generating the boost current $I_{boost}$ when one of $I_m$ and $I_p$ is one of less than the minimum value, and greater than the maximum value wherein the differential amplifier means further includes a pair of BJTs, each BJT including a base wherein the control signal is coupled to the bases of the BJTs, and further includes a pair of FET current mirrors operatively coupled to the differential amplifier means in combination with said correction feedback circuit means.

7. The apparatus of claim 6, wherein $I_{boost}$ is proportional to a difference between the minimum value and $I_m$.

8. The apparatus of claim 6, wherein $I_{boost}$ is proportional to a difference between a minimum value $I_{bleed}$ and $I_m$ and the feedback circuit means includes a second current source for generating a current equal to $I_{bleed}$.

9. The apparatus of claim 8, wherein the feedback circuit means further includes at least one FET operatively coupled to the pair of FET current mirrors and the current source.

10. The apparatus of claim 9, wherein the at least one FET of the feedback circuit means senses $I_m$.

11. The apparatus of claim 10, wherein the control signal is a voltage control signal.

12. The apparatus of claim 10, wherein $I_{boost}$ is equal to a constant, k times the difference of $I_{bleed}$ and $I_m$.

13. The apparatus of claim 10, wherein the constant k is approximately 100.

14. A method of generating a current pair $I_p$, $I_m$ wherein the ratio of the pair is exponentially related to a control signal, wherein the control signal is a voltage control signal, and wherein one of $I_p$ and $I_m$ is one of greater than a minimum value and less than a maximum value, comprising the steps of:

a. inputting the control signal;
   a1. determining a bleed current $I_{bleed}$;

b. generating a current pair $I_m$, $I_p$ as a function of the control signal and a bias current $I_{bias}$, where $I_{bias}$ is a function of a boost current $I_{boost}$, wherein the sum of $I_p$ and $I_m$ equals $I_{bias}$;

c. sensing one of $I_m$ and $I_p$; and d. generating the boost current $I_{boost}$ by setting $I_{boost}$ equal to a constant k times the difference of $I_{bleed}$ and $I_m$, when one of $I_m$ and $I_p$ is one of less than the minimum value and greater than the maximum value, wherein $I_{boost}$ is proportional to a difference between one of the minimum value and the maximum value and one of $I_m$ and $I_p$ and $I_{bias}$ is equal to the sum of $I_{boost}$ and a fixed current $I_{fixed}$.

* * * * *